United States Patent
Rebollo Pimentel

(10) Patent No.: US 10,284,081 B2
(45) Date of Patent: May 7, 2019

(54) CHARGE PUMP REGULATION

(71) Applicant: NXP B.V., Eindhoven (NL)

(72) Inventor: Ivan Jesus Rebollo Pimentel, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/289,172

(22) Filed: Oct. 8, 2016

(65) Prior Publication Data
US 2017/0104408 A1    Apr. 13, 2017

(30) Foreign Application Priority Data

Oct. 13, 2015 (EP) ................................ 15189603

(51) Int. Cl.
*H02M 3/07* (2006.01)
*G11C 5/14* (2006.01)
*H02M 1/00* (2006.01)

(52) U.S. Cl.
CPC ............ *H02M 3/07* (2013.01); *G11C 5/145* (2013.01); *H02M 2001/0003* (2013.01)

(58) Field of Classification Search
CPC ....................................................... H02M 3/07
USPC ........................................ 327/536, 540, 534
See application file for complete search history.

(56) References Cited

U.S. PATENT DOCUMENTS

| 5,291,446 A | 3/1994 | Van Buskirk et al. |
| 8,283,972 B1 | 10/2012 | Raghavan et al. |
| 2004/0089717 A1* | 5/2004 | Harari ............... G06F 13/387 235/441 |
| 2008/0116961 A1* | 5/2008 | Yoshikawa ............ G11C 5/145 327/536 |
| 2009/0167418 A1* | 7/2009 | Raghavan ............. H02M 3/073 327/536 |

FOREIGN PATENT DOCUMENTS

EP    2 299 576 A1    3/2011

OTHER PUBLICATIONS

Extended European Search Report for Patent Appln. No. 15189603.2 (dated Apr. 8, 2016).
Li, T. et al. "A Feedback Based Charge Pump", IEEE Institute of Electrical and Electronics Engineer, 3 pgs (2011).
Cabrini, A. et al. "High-Efficiency Regulated Charge Pump for Non-Volatile Memories", IEEE Institute of Electrical and Electronics Engineers, 4 pgs (2006).

* cited by examiner

*Primary Examiner* — Thomas Skibinski

(57) ABSTRACT

A regulated charge pump circuit and method of operation are described. A charge pump is configured to supply an output voltage to a load, and includes at least one charge pump stage, a charge pump driver arranged to drive the charge pump stages and a controllable current source connected between a supply voltage and the charge pump driver. An analog regulation loop includes a measurement circuit arranged to output an analog regulation signal indicative of a difference between a current value of the output voltage and a target value of the output voltage. A signal path is connected to the charge pump to supply the analog regulation signal to the controllable current source to operate the controllable current source to modulate the supply voltage that can be provided to the charge pump driver to regulate the output voltage.

15 Claims, 2 Drawing Sheets

CHARGE PUMP REGULATION

CROSS-REFERENCE TO RELATED APPLICATIONS

This application claims the priority under 35 U.S.C. § 119 of European patent application no. 15189603.2, filed on Oct. 13, 2015, the contents of which are incorporated by reference herein.

The present specification relates to charge pumping and in particular to charge pump circuitry including control circuitry and a method of controlling charge pumping.

Charge pumps are electronic circuits which may be used to convert DC voltages. One or more capacitors may be used to convert an input DC voltage to either a higher DC voltage or a lower DC voltage. Switching is generally used to switch between applying a voltage to the capacitors, to charge them up, and then to discharge the capacitors to supply the converted voltage to some load. Control or regulation circuitry may be used to control or regulate the converted DC voltage that the charge pump supplies.

Charge pumps have a wide range of applications. One area of application of charge pumps is in connection with non-volatile memory devices, such as, by way of non-limiting example, an EEPROM (Electronically Erasable and Programmable Read Only Memory) or a Flash memory integrated circuit. The content of a non-volatile memory may be erased, programmed or read. Each of these operations consumes some electrical power. Typically erasing and programming operations use higher voltages, compared to reading operations, and so a charge pump may be used to generate the higher voltage signal used during erasing and programming of a non-volatile memory.

In some applications, and for some electronic devices, it may be beneficial to reduce the electrical power consumed during non-volatile memory use. Hence, charge pumps having high electrical efficiency, in terms of low current consumption may be useful.

In applications where the charge pump is used to generate a high voltage, some control of the voltage level may be useful, for example to increase device or circuit reliability by reducing the likelihood of device damage.

Also, some control of the voltage level may be useful to tune the voltage level to improve performance of the load to which the voltage is to be supplied. For example, when supplying a non-volatile memory, control of the voltage level may improve the performance of the memory in terms of endurance and retention of data in the non-volatile memory.

The present specification relates to charge pump circuitry and methods of operation of charge pump circuitry.

According to a first aspect of the present disclosure, there is provided a regulated charge pump circuit, comprising: a charge pump configured to supply an output voltage to a load, the charge pump including at least one charge pump stage, a charge pump driver arranged to drive the at least one charge pump stage and a controllable current source connected between a supply voltage and the charge pump driver; and an analog regulation loop including a measurement circuit arranged to output an analog regulation signal indicative of a difference between a current value of the output voltage and a target value of the output voltage and a signal path connected to the charge pump to supply the analog regulation signal to the controllable current source and wherein the analog regulation signal operates the controllable current source to modulate the electrical power that the supply voltage can provide to the charge pump driver to regulate the output voltage.

The analog regulation loop may improve various aspects of the performance of the charge pump circuitry compared to using digital regulation.

In one or more embodiments, the controllable current source may be a transistor.

In one or more embodiments, the regulated charge pump circuit may further include a current limiting circuit and wherein the current limiting circuit is arranged to limit the current that can be supplied to the charge pump driver.

In one or more embodiments, the current limiting circuit may be connected between the supply voltage and the controllable current source and act as a source of current.

In one or more embodiments, the current limiting circuit may be connected between the controllable current source and a ground, chassis or common connection and acts as a sink of current.

In one or more embodiments, the current limiting circuit may be a current mirror. The current mirror may include a pair of transistors with their gates connected and a current source connected to a one of the pair of transistors. The current source may be a constant current source.

In one or more embodiments, the measurement circuit may include an amplifier arranged to receive a signal indicative of the current value of the output voltage at a first input and to output the analog regulation signal.

In one or more embodiments, the measurement circuit may include a voltage divider arranged to provide the signal indicative of the current value of the output voltage. The voltage divider may be a capacitive voltage divider. The capacitive voltage divider may include at least a first capacitor and a second capacitor. The signal indicative of the current value of the output voltage may be provided from a connection between the first capacitor and the second capacitor.

In one or more embodiments, the amplifier may be arranged to receive a reference signal at a second input.

In one or more embodiments, the amplifier may be configured to operate as a differential amplifier and to cause the analog regulation signal to increase as the difference between its input signals decreases.

In one or more embodiments, the target value of the output voltage may be at least 1V, 3V, 5V or 10V.

In one or more embodiments, the target value of the output voltage may be in the range of from 1V to 20V or from 3V to 15V or from 5V to 10V.

According to a second aspect of the present disclosure, there is provided a package comprising a lead frame and a semi-conductor integrated circuit, wherein the semi-conductor integrated circuit is configured to provide the regulated charge pump circuit of the first aspect.

According to a third aspect of the present disclosure, there is provided an electronic apparatus including the regulated charge pump circuit of the first aspect or the package of the second aspect.

In one or more embodiments, the electronic apparatus may be a power apparatus such as a boosting system, a level shifter, an energy harvester or a rectifier.

In one or more embodiments, the electronic apparatus may further including one or more memory devices. The or each memory device may be a volatile or a non-volatile memory device. The output voltage may be supplied to the or each memory device to control operation of the or each memory device. The controlled operation or operations may be a write operation and/or an erase operation.

In one or more embodiments, the electronic apparatus may be a RFID or a NFC apparatus. The electronic apparatus may be a RFID tag or a NFC tag.

According to a fourth aspect of the present disclosure, there is provided a method of controlling a charge pump to regulate an output voltage to be supplied to a load, comprising: measuring the difference between a current value of the output voltage and a target value of the output voltage to generate an analog regulation signal indicative of the measured difference; and supplying the analog regulation signal to a controllable current source connected between a voltage supply and a charge pump driver of the charge pump to modulate the electrical power supplied to the charge pump driver.

Features of the first aspect may also be, or correspond to, counterpart features of the fourth aspect.

Example embodiments of the invention will now be described in detail, by way of example only, and with reference to the accompanying drawings, in which.

Similar items in the different Figures share like reference signs unless indicated otherwise.

The charge pump circuit is suitable for any charge pump application. It may be used in applications where low ripple or noise or area are relevant. For example, it may be used in boosting systems, level shifters, and energy harvesting or charge pump rectifiers.

Figure 1:
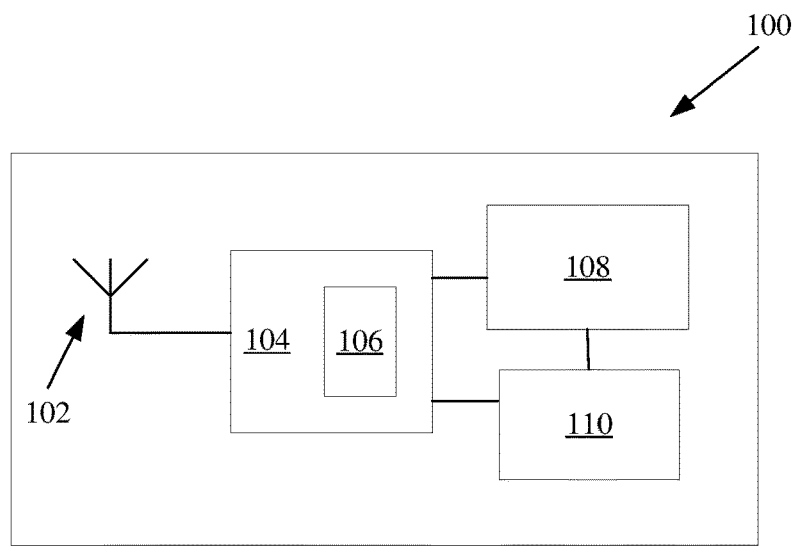
FIG. 1 shows a schematic block diagram of an electronic apparatus including a charge pump circuit.

With reference to FIG. 1 there is shown a schematic block diagram of an electronic apparatus 100 including a charge pump circuit. By way of example only, and for the purposes of clarity of explanation, the charge pump circuit will be described within the context of the electronic apparatus 100 being an RFID tag. However, it will be appreciated that the charge pump circuit is not limited in application to an RFID tag and may be used in wide range of applications as discussed above. As well as RFID tags, the charge pump circuit may be used in electronic apparatus of other tagging technologies, for example in NFC (Near Field Communication) tags.

As illustrated in FIG. 1, the RFID tag 100 may include an antenna 102, which may be in the form of a loop antenna, a dipole antenna or a combination, depending on the specific wireless signals used. The antenna 102 is connected to power supply circuitry 104 which may include a rectifier arranged to convert induced AC electrical signals into DC electrical power. The power supply circuitry 104 may provide single or multiple supply level voltages for use by the remainder of the remainder of the RFID tag. The power supply circuitry 104 includes charge pump circuitry 106 as described in greater detail below. In other embodiments, the charge pump circuitry 106 may be provided separately to the power supply circuitry 104. The construction of RFID tags is known generally to a person of ordinary skill in the art and therefore various components commonly present are not shown in FIG. 1 for the sake of clarity of explanation. The RFID tag include a data processing component 108, in communication with at least one memory device 110, which may include non-volatile memory, for example in the form of an EEPROM, Flash memory, MTP (Multiple Times Programmable) memory, OTP (One Time Programmable) memory, non-volatile RAM or similar, and/or volatile memory, for example various type of volatile RAM.

The power supply circuit 104 provides various power supply levels to the various parts of the RFID tag. The charge pump circuit 106 is arranged to generate and supply a high voltage suitable for operation of the memory device or devices 110 and in particular during erase and write operations. In some embodiments, the RFID tag may have no on-board power supply, such as a battery, and the RFID tag obtains all of its electrical power wirelessly, for example by induction or radiation, when an RFID reader wirelessly communicates with the RFID tag.

In applications in which there is no on-board power supply, and the apparatus is powered by wirelessly, it is preferable for the apparatus to have very low power consumption so that the apparatus will operate reliably and also over a wide range of distances from the source of wireless power.

For example, when the apparatus 100 is an RFID tag, then an embedded non-volatile memory 110, may be used for various purposes, for example, to store an identification number, configuration options and user memory for the data processor 108. The content of the memory 110 can be erased, programmed and read. Each of these operations consumes power and so can limit the operating range of the RFID tag. If the tag is too far from the reader then insufficient power will be induced and available to operate the tag. This limitation is greater during erase and program operations using a high-voltage and having a higher current consumption. The charge pump circuitry 106 may be used to achieve the high-voltage needed by the non-volatile memory and/or any other parts of the apparatus 100 which may use a high-voltage supply.

A charge pump has a high efficiency when it has a low current consumption. The high voltage level provided by the charge pump may be controlled, for example to fine tune the high-voltage level for the optimum performance of the non-volatile memory 110, in terms of endurance and retention of data, and also to ensure high reliability of the apparatus 100, by avoiding voltage levels sufficiently high to damage any parts of the apparatus. Hence, regulation is used to control the high-voltage level that the charge pump circuit 106 can generate.

A memory device can be considered as a large capacitor that has to be charged up to a required voltage level over a time. The current, i, used to charge a capacitor, C, may be expressed as $i = C\, dV/dt$, where t denotes time. From the preceding, it follows that: the larger the memory, the greater the current; the higher the voltage, the higher the current; and the shorter the time, the higher the current. Also, initially, i.e. at t=0, at the beginning of the operation of the charge pump, $dV/dt \to \infty$. Hence, a highly efficient regulation loop may be provided which can cope with high rates of voltage change and high current consumption.

Figure 2:
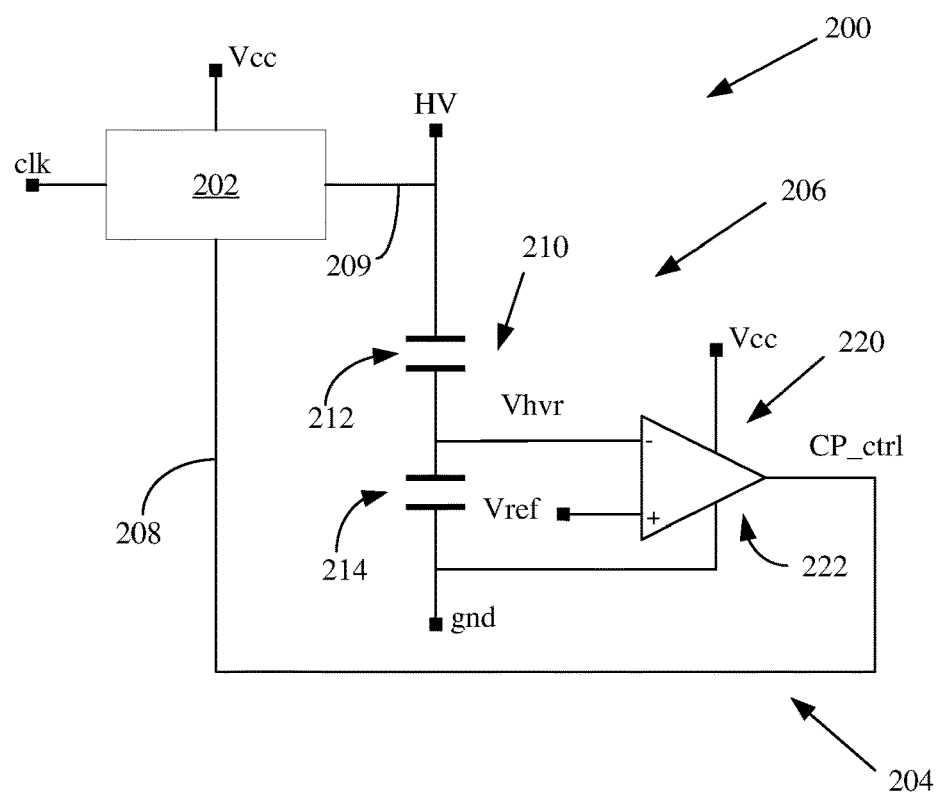
FIG. 2 shows a schematic block circuit diagram of a charge pump circuit including an analog control loop.

FIG. 2 shows a schematic circuit diagram of charge pump circuitry 200, corresponding generally to circuitry 106 of FIG. 1. Charge pump circuitry 200, includes a charge pump 202 and a regulation or control loop 204, and so may be considered a regulated charge pump circuit. As discussed in greater detail below, regulation loop 204 is an analog regulation loop and not digital. The charge pump 202 receives the supply voltage, Vcc, as an input and also receives a clock signal, clk. In other embodiments, the charge pump may receive any suitable input voltage, including ground. The clock signal may be supplied by the data processor, 108, or may be supplied by a separate oscillator or some other clock signal source. The nature of the clock signal will vary depending on the application and target efficiency, but is typically rail-to-rail, voltage based, and with a frequency depending on the type of the charge-pump stages of the charge pump 202, and with a sinusoidal or, usually, a square waveform. The analog regulation loop 204 provides an analog control signal, CP_ctrl, to control operation of the charge pump 202 so as to regulate the level of the high voltage signal, HV, which the charge pump supplies from its output 206. When applied to a memory, the high voltage level, HV, may be between 5V and 15V, whereas for other applications HV may be whatever voltage level and sign, positive or negative, is appropriate for the application The regulation loop 204 includes measurement circuit 206 and a control connection 208 connected to the charge pump 202. The measurement circuit includes a high voltage divider 210 connected between the high voltage output of the charge pump, HV, and common, chassis or ground. The high voltage divider 210 may be in the form of a capacitive high voltage divider comprising a first capacitor 212 and a second capacitor 214 connected in series. The measurement circuit 206 of the regulation loop 204 also includes a difference measuring circuit 220 arranged to output the analog control signal, CP_ctrl, which is a signal indicative of the difference between a reference voltage, Vref, and a signal, Vhvr, indicative of the current value of HV. The signal, Vhvr, is a measure of the voltage across the first capacitor 212 compared to the highest possible value of HV, and hence may be considered a high voltage ratio. In the present example, Vhvr, may vary between about 600 mV and 1V.

In the embodiment illustrated in FIG. 200, the difference measuring circuit 220 is implemented using an operational amplifier 222 configured in a differential mode of operation and having Vref connected to a first input 224 and Vhvr connected to a second input 226. The output signal, CP_ctrl, from the output 228 of the operational amplifier 222 is used as a charge pump control signal and is supplied as an input to the charge pump 202 to close the regulation or control loop via connection line 208.

Figure 3:
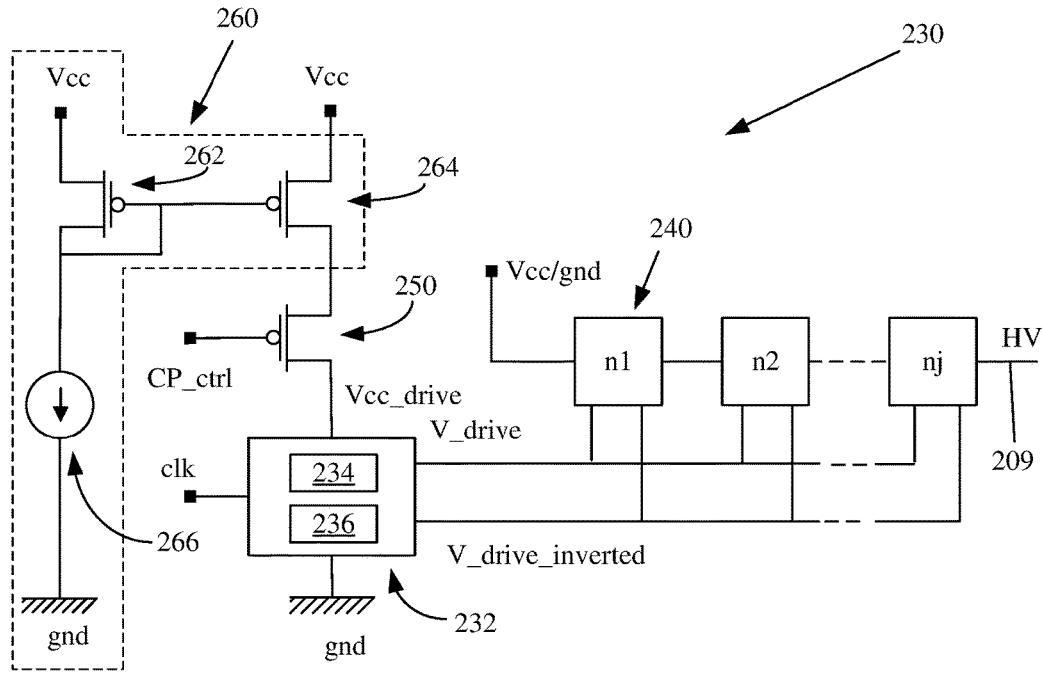
FIG. 3 shows a schematic circuit diagram of a first example embodiment of a charge pump of the charge pump circuit shown in FIG. 2.

FIG. 3 shows a schematic circuit diagram of a first example embodiment of a charge pump 230 corresponding generally to part 202 of the regulated charge pump circuitry 200 shown in FIG. 2. Charge pump 230 includes a charge pump driver 232 which includes a buffer 234 and an inverter 236. The charge pump driver 232 receives the clock signal, clk, as an input and the clock signal is buffered by the buffer circuit 234 and output as a first drive signal, V_drive, having a generally similar form to the clock signal, clk. The inverter circuit 236 also receives the clock signal and outputs a second drive signal, V_drive_inverted, which is the inverse of the first drive signal and has an inverse form to the clock signal. The buffer circuit 234 and inverter circuitry 236 may be analog or digital circuits or combinations of analog and digital components, for example operational amplifiers and/or logic gates as are generally known in the art. The magnitude of the first and second drive signals that are output depends on the magnitude of the supply voltage, Vcc_drive, provided to the charge pump driver 232.

The charge pump 230 includes at least one charge pump stage, e.g. charge pump stage 240. The number of charge pump stages will depend on the application requirements and may be, for example between one and eight, although a greater number may also be used. The charge pump stages, n1 to nj, may each be constructed from a network of transistors and capacitors and their construction and operation is generally known in the art. The first and second drive signals, V_drive and V_drive_inverted, are both supplied to each charge pump stage and the final charge pump stage, nj, can output the high voltage signal, HV. The charge pump stages can be selectively connected to the supply voltage, Vcc or ground.

The charge pump 230 also includes a transistor 250 connected between the supply voltage Vcc and the charge pump driver 232. The transistor 250 acts as a controllable current source which modulates the electrical power that the supply voltage Vcc can supply to the charge pump driver 232. In the illustrated embodiment, the transistor 250 is a PMOS transistor. The charge pump control signal, CP_ctrl, is supplied to the gate of the transistor and is used to modulate the electrical power supplied to the charge pump driver 232. This changes the swing of the first and second driving signals, V_drive and V_drive_inverted, and hence the charge transferred into the charge pump stages 240 and the level of HV, as described in greater detail below. A current limiting circuit 260 is also provided. In the embodiment illustrated in FIG. 3, the current limiting circuit 260 is connected between the supply voltage, Vcc, and the source of transistor 250. The current limiting circuit 260 is in the form of a current mirror and includes a first transistor 262 and a second transistors 264, each of which may be a PMOS transistor, with their gates connected and their respective sources connected to the supply voltage, Vcc. The drain of the first transistor 266 is connected to ground via a current source 266. The current source 266 may be a constant current source or a non-constant current source. The drain of the second transistor 260 is connected to the source of the supply voltage modulating transistor 250 to limit the current. As is generally known in the art, a current mirror operates so that the current in one limb of the circuit mirrors the current in another limb of the circuit. Hence, the current passing through the second transistor 264 is caused to copy a proportion of the current passing through the first transistor 262 as governed by the current source 266. Hence, the current passing through the second transistor 264 and supplied to the supply voltage modulation transistor 250 is kept limited to a proportion of the current of the current source 266.

In other embodiments, the current limiter circuit 260 may be connected to the bottom voltage rail and acts as a current limiting sink of current, instead of to the top rail to act as a current limiting source of current.

As noted above, initially, i.e. at t=0, dV/dt→∞, and so it can be beneficial to limit the current required initially. A current mirror may be used as a simple mechanism to automatically limit the current and the ramp in the HV level will depend largely on the memory size (i.e. be proportional to C, with a larger memory size having a greater capacitance, C).

Operation of regulated charge pump circuit 200, using the charge pump 230, is generally as follows. Initially, the capacitors 212, 214 are uncharged having been discharged, in reset state, by having all their nodes pulled to ground. Hence, HV is zero and the difference between Vhvr and Vref is a maximum. The control signal CP_ctrl is pulled to ground, allowing the full supply voltage to be supplied to the charge pump driver 232. Initially, the transistor 250 is fully on and the drive signals, V_drive and V_drive_inverted, output by the charge pump driver are swinging rail-to-rail, although a limited amount of current is supplied to the charge pump driver 232 due to the current limiting effect of the current mirror. Hence, the swing of the drive voltage signals, V_drive and V_drive_inverted, that are output from the charge pump driver 232 are a maximum and start to pump the charge pump stages 240 and increase the high-voltage, HV 209. The voltage at the node between the first 212 and second 214 capacitors of the capacitive voltage divider 210, is a ratio, or proportion, of the high-voltage, Vhvr, that increases proportionally as the value of HV does. Hence, the difference between Vref and Vhvr decreases and the voltage level of CP_ctrl increases.

CP_ctrl is supplied to the gate of PMOS transistor 250, and CP_ctrl tends to Vcc−Vth (the PMOS transistor voltage) as Vhvr tends to Vref. Generally speaking, the extremes of behaviour of transistor 250 would be that when Vcc−CP_ctrl>Vcc−Vth, PMOS transistor 250 is ON, and the charge-pump circuit 230 pumps, otherwise PMOS transistor 250 is OFF and the charge-pump circuit 230 does not pump. However, the continuous, analog nature of CP_ctrl provides complete coverage of the range between these extremes of behaviour. Hence, CP_ctrl takes a value just sufficient to have the transistor 250 in an operational state that modulates the supply voltage, Vcc_drive, of the charge pump driver 232 so as to keep Vhvr=Vref (in the ideal, but in practice there will likely be some offset error), and thus keeping HV regulated. The transistor 250 is effectively working as a voltage controlled current source.

The same approach can be applied to using an NMOS transistor instead, in which case, CP_ctrl tends to Vth (the NMOS transistor voltage) as Vhvr tends to Vref.

CP_ctrl increasing reduces the conductivity of transistor 250 hence reducing, by modulation, the voltage supply, Vcc_drive, provided to the charge pump driver 232. Hence, as transistor 250 is caused to reduce its conductivity by CP_ctrl increasing, the magnitude of the electrical power provided to the charge pump driver 232 is reduced. Consequently the magnitude of the drive signals, V_drive and V_drive_inverted, is reduced and hence the amount of charge transfer to charge pump stages 240 during a clock signal cycle is reduced.

This continues until Vhvr becomes sufficiently close to Vref, that CP_ctrl is so large that transistor 250 is biased sufficiently to keep Vhvr at the same value as Vref, and hence the drive signals V_drive and V_drive_inverted are kept constant to regulate the high-voltage HV. Hence, by appropriately selecting the value of Vref, the value of HV can be set.

After each discharge of the high voltage output, HV, for example after a write or erase memory operation, the current value of the output voltage, HV, is low, for example around 0V to 2V, and the control signal, CP_ctrl, is close to zero as the difference between Vhvr and Vref, (with Vref setting the target output voltage, for example to 10V) is a maximum. Hence, the electrical power supplied to the charge pump driver is a maximum and the current supplied to the charge pump driver is limited by the action of the current mirror so as to help avoid or reduce any performance problems caused by excessive currents. As the current value of HV ramps up towards its target value, the difference between Vhvr and Vref reduces and CP_ctrl increases and so the electrical power supplied to the charge pump driver also decrease. CP_ctrl continues to increase as the current value of HV ramps and current is consumed by the charge pump driver. When the current value of HV reaches the target value, e.g. 10V, then ramping stops and CP_ctrl reduces to a lower steady state value which maintains the current value of HV at the target value as discussed above and current consumption is reduced to close to zero.

Hence, the output of the differential operational amplifier 222 is used to control transistor 250 in order to control the driving capability or charge transfer of the charge pump driver 232 by modulating its supply voltage, Vcc_drive. This approach may give rise to a number of benefits. Continuous pumping of the charge pump stages and continuous-time control are possible owing to the continuous nature of the control signal, CP_ctrl. There is low ripple in the high voltage signal, HV, that can be supplied by the regulated charge pump circuitry 200. Spike levels in the current supplied to the charge pump stages by the drive signal, V_drive and V_drive_inverted, are modulated. No high slew-rate signal is required for the regulation signal, CP_ctrl. Also, a small circuit area may be used to implement the analog regulation loop of the charge pump circuit as an integrated circuit.

Figure 4:
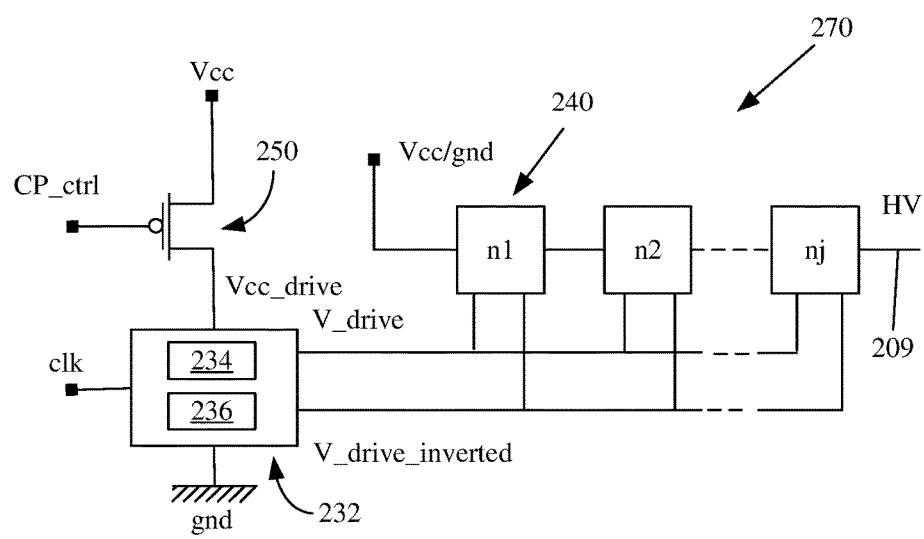
FIG. 4 shows a schematic circuit diagram of a second example embodiment of a charge pump of the charge pump circuit shown in FIG. 2.

FIG. 4 shows a schematic circuit diagram of a second embodiment of a charge pump 270 corresponding generally to part 202 of FIG. 2. The second embodiment is similar to the first embodiment illustrated in FIG. 3, but omits the current limiting circuit 260. The highest current consumption is at time t=0, but as there is no current limiting circuit, the current consumption depends on the values of "C" and "dV/dt". Hence, this embodiment may be more suitable for applications in which C and dV/dt are smaller.

Operation of the circuit 200, when including charge pump 270 is generally similar to that described above when charge pump 230 is used, but without the effects of the current limiting circuit. Hence, CP_ctrl provides an analog control signal which increases as Vhvr approaches Vref and controls capacitor 250 to modulate the supply voltage Vcc_drive supplied to the charge pump driver 232. Hence, the benefits of an analog regulation circuit are also realised when using the embodiment of FIG. 4 for the charge pump in the regulated charge pump circuitry 200

The regulated charge pump circuitry 200 is particularly suitable for high reliability products and also low power applications. The analog regulation loop avoids a digital approach to the control loop and regulation. High current spikes during charge pump stage charging can be avoided which may reduce current consumption and/or may improve device reliability and lifetime by reducing or avoiding the application of high electrical stresses to the device. The circuitry may also reduce voltage ripple in the high voltage, HV, which may also improve the reliability of operation and/or lifetime of the device to which the high voltage signal is supplied, e.g. the non-volatile memory in the RFID tag example. The circuitry is simple and largely analog and hence avoids the need for multiple logic and/or digital circuits and other auxiliary components and circuits in the regulation or control loop thereby reducing the size and complexity of the circuitry compared to more complex and/or more digital approaches.

In some embodiments, some or all of the regulated charge pump circuitry 200 may be implemented as a semi-conductor integrated circuit or as part of a semi-conductor integrated circuit. The semi-conductor integrated circuit may be provided as a die in a package which also includes a lead frame.

As discussed above in some applications, the regulated charge pump circuit 200 may be used in an RFID tag, a HF or UHF RFID tag, and NFC tag or similar. However, the regulated charge pump circuit 200 is not limited to use in such electronic apparatus and may be used in a wide range of other types of electronic devices or apparatus. For example charge pumps circuits can be used in level shifters, LCD or LED drivers, in memories and/or microprocessors, in EEPROM and flash memory integrated circuits and in high side drivers for power MOSFETS and IGBTs.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A regulated charge pump circuit, comprising:
   a charge pump configured to supply an output voltage to a load, the charge pump including at least one charge pump stage, a charge pump driver arranged to drive the at least one charge pump stage and a controllable current source connected between a supply voltage and the charge pump driver;
   an analog regulation loop including a measurement circuit arranged to output an analog regulation signal indicative of a difference between a current value of the output voltage and a target value of the output voltage and a signal path connected to the charge pump to supply the analog regulation signal to the controllable current source and wherein the analog regulation signal operates the controllable current source to modulate the electrical power that the supply voltage can provide to the charge pump driver to regulate the output voltage; and
   a current limiting circuit, wherein the current limiting circuit is arranged to limit the current that can be supplied to the charge pump driver, wherein the current limiting circuit operates independently of a clock signal input.

2. The regulated charge pump circuit as claimed in claim 1, wherein the current limiting circuit is connected between the supply voltage and the controllable current source and acts as a source of current.

3. The regulated charge pump circuit as claimed in claim 1, wherein the current limiting circuit is connected between the controllable current source and a ground connection and acts as a sink of current.

4. The regulated charge pump circuit as claimed in claim 1, wherein the current limiting circuit is a current mirror.

5. The regulated charge pump circuit as claimed in claim 1, wherein the measurement circuit includes an amplifier arranged to receive a signal indicative of the current value of the output voltage at a first input and to output the analog regulation signal.

6. The regulated charge pump circuit as claimed in claim 5, wherein the measurement circuit includes a voltage divider arranged to provide the signal indicative of the current value of the output voltage.

7. The regulated charge pump circuit as claimed in 6, wherein the amplifier is arranged to receive a reference signal at a second input.

8. The regulated charge pump circuit as claimed in claim 5, wherein the amplifier is configured to operate as a differential amplifier and to cause the analog regulation signal to increase as the difference between its input signals decreases.

9. The regulated charge pump circuit as claimed in claim 1, wherein the target value of the output voltage is at least 1V.

10. A package comprising a lead frame and a semi-conductor integrated circuit, wherein the semi-conductor integrated circuit is configured to provide the regulated charge pump circuit as claimed in claim 1.

11. An electronic apparatus including the regulated charge pump circuit of claim 1.

12. The electronic apparatus of claim 11, and further including a memory and wherein the output voltage is supplied to the memory to control operation of the memory.

13. The electronic apparatus of claim 12, wherein the electronic apparatus is an RFID tag or an NFC tag.

14. The electronic apparatus of claim 12, wherein the memory is a non-volatile memory, wherein the output voltage is supplied to the non-volatile memory to control a write operation or a read operation of the non-volatile memory.

15. A method of controlling a charge pump to regulate an output voltage to be supplied to a load, comprising:
   measuring the difference between a current value of the output voltage and a target value of the output voltage to generate an analog regulation signal indicative of the measured difference;
   supplying the analog regulation signal to a controllable current source connected between a voltage supply and a charge pump driver of the charge pump to modulate the electrical power supplied to the charge pump driver; and
   limiting the current that can be supplied to the charge pump driver using a current limiting circuit, wherein the current limiting circuit operates independently of a clock signal input.

* * * * *